INVENTOR.
JACK AVINS
BY
Eugene M. Whitacre
Attorney

Jan. 30, 1968 J. AVINS 3,366,889

INTEGRATED ELECTRICAL CIRCUIT

Filed Sept. 14, 1964 2 Sheets-Sheet 2

INVENTOR.
JACK AVINS

BY

Eugene M. Whitacre

Attorney

United States Patent Office 3,366,889
Patented Jan. 30, 1968

3,366,889

INTEGRATED ELECTRICAL CIRCUIT

Jack Avins, Princeton, N.J., assignor to Radio Corporation of America, a corporation of Delaware Filed Sept. 14, 1964, Ser. No. 396,140
33 Claims. (Cl. 330—19)

This invention relates to signal translating systems, and more particularly to amplifiers or amplifier-limiters which can be economically fabricated using integrated circuit techniques.

As used herein, the term integrated circuit refers to a unitary or monolithic semiconductor device which is the equivalent of a network of interconnected active and passive circuit elements. Various problems have presented themselves in the design of amplifier circuits to be formed in an integrated circuit device. For example, in cascade connected resistance-capacitance amplifiers, the use of coupling capacitors between successive stages is objectionable in some applications. For one thing, the coupling capacitor occupies considerable area on the integrated circuit device, even for a relatively small amount of capacitance. The small coupling capacitance limits not only the low frequency response of the amplifier, but also the high frequency response, and therefore the gain at the desired signal frequency and the parasitic shunt capacitance which occurs in integrated circuit capacitor structures limits the high frequency response of the circuit. In addition to the foregoing, limitations in the processing techniques presently used for forming capacitors are such that the resultant capacitors may be a substantial source of trouble due to shorting between the plates thereof.

In cascade connected direct coupled amplifiers, the direct voltage appearing at the output electrode of one stage comprises the voltage which is applied to the succeeding stage. As a result, complicated biasing networks are used to establish the desired operating point for each of the cascaded stages. In addition, direct current (D-C) feedback must be provided for operating point stabilization. Where substantial gain is to be effected in a single integrated circuit device, the phase shifts within the feedback loop are such as to increase the likelihood of circuit instability.

An amplifier stage embodying the invention includes three transistors. A first and second of the transistors are connected as an emitter coupled amplifier with the first transistor operating in the base-input, common-collector mode, and with the second transistor operating in the emitter-input, common-base, collector-output mode. The third transistor, connected as an emitter follower, is directly coupled to receive the signals developed at the collector electrode of the second transistor.

In accordance with a first embodiment of the invention a resistor connected in common to the emitter electrodes of the first and second transistors is substantially one-half that of the value of a load resistor connected to the collector electrode of the second transistor. The proportioning of the resistors in this manner provides stabilization of the output voltage in the presence of temperature changes or supply voltage variations.

In accordance with a second embodiment of the invention the direct voltage at the collector of the second transistor is set at a value which reverse biases the collector-base junction of the second transistor by an amount equal to the forward bias voltage existing between the emitter and base electrodes of the three transistors. The voltage at the emitter electrode of the third transistor is substantially equal to the collector voltage of the second transistor les the opposing base-to-emitter voltage of the third transistor. Thus the resultant D-C output voltage of the third transistor is substantially equal to that at the bases of the first and second transistors with respect to a point of reference potential. Accordingly, further amplifier stages including three similarly connected transistors may be directly driven from the emitter electrode of the third transistor without additional biasing networks.

Several amplifier stages embodying the invention may be connected in cascade. Where there are ($n$) direct coupled amplifier stages of the type described, stabilization can be effected by providing a direct current D-C feedback loop around ($n$—1) of the amplifier stages. The direct current feedback loop extends from the emitter of the emitter follower transistor of the next-to-last amplifier stage to the base electrode of the second transistor of the first amplifier stage. In accordance with one aspect of the invention, an offset voltage is provided in the feedback loop to cancel voltages developed by currents flowing in the feedback loop. The offset voltage serves to maintain the balance between the emitter coupled transistors of the last amplifier stage.

The amplifier stages within the feedback loop may be operated at low level and provide an output voltage which is stabilized at the desired D-C level to drive the last amplifier stage which may be operated at a higher level. The last stage need not be included in the feedback loop since it is automatically balanced to the desired degree by the feedback loop which precedes it. The fact that the last amplifier stage need not be included in the main feedback loop reduces the amount of gain enclosed by the feedback loop and thereby reduces the susceptibility of the circuit to oscillation.

In accordance with a specific embodiment of the invention a tapped voltage regulating circuit may be provided as an integral portion of the integrated circuit device. A plurality of rectifying devices formed in the integrated circuit device are connected in series between a pair of terminals adapted to be connected to a source of operating potential. The rectifiers are poled so as to be forward biased by the operating potential supply. Once the rectifiers have been forward biased, changes in the voltage of the operating potential supply produces only minor changes in voltage across the individual rectifying devices. Appropriate taps taken across various combinations of the rectifier devices provide different values of regulated voltages which may be used in the various amplifier stages. If desired, transistors, connected in an emitter follower configuration, may be used in connection with the rectifier devices to provide a power supply having a lower internal impedance. Such regulated voltages are particularly useful with the low level amplifier stages mentioned above.

The terms resistors, capacitors, transistors, rectifiers, etc. as used herein are intended to apply to the equivalent device as incorporated in or on an integrated circuit device.

The novel features which are considered to be characteristic of this invention are set forth with particularity in the appended claims. The invention, itself is, however, both to its organization and method of operation as well as additional objects and advantages thereof will best be understood from the following description when read in connection with the accompanying drawing in which:

Figure 2:
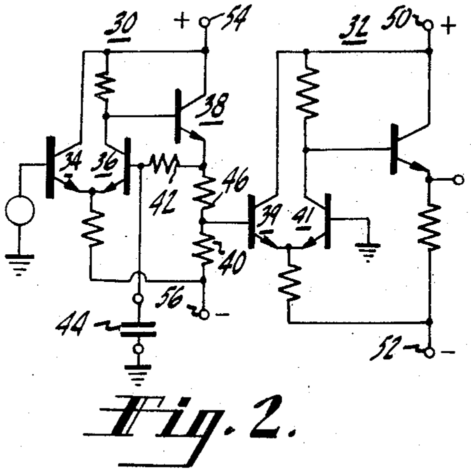
FIGURE 2 is a schematic circuit diagram of a pair of amplifier stages connected in cascade.
Figure 4:
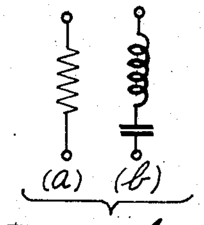
Figure 6:
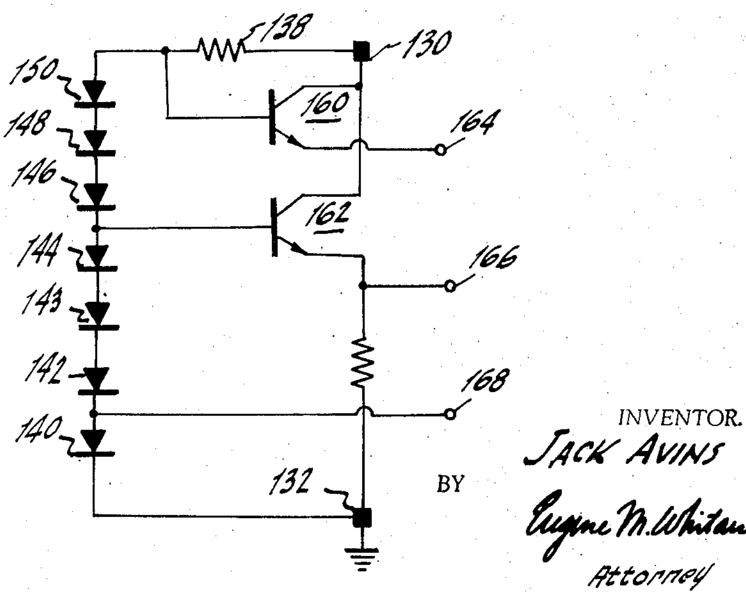
Figure 5:
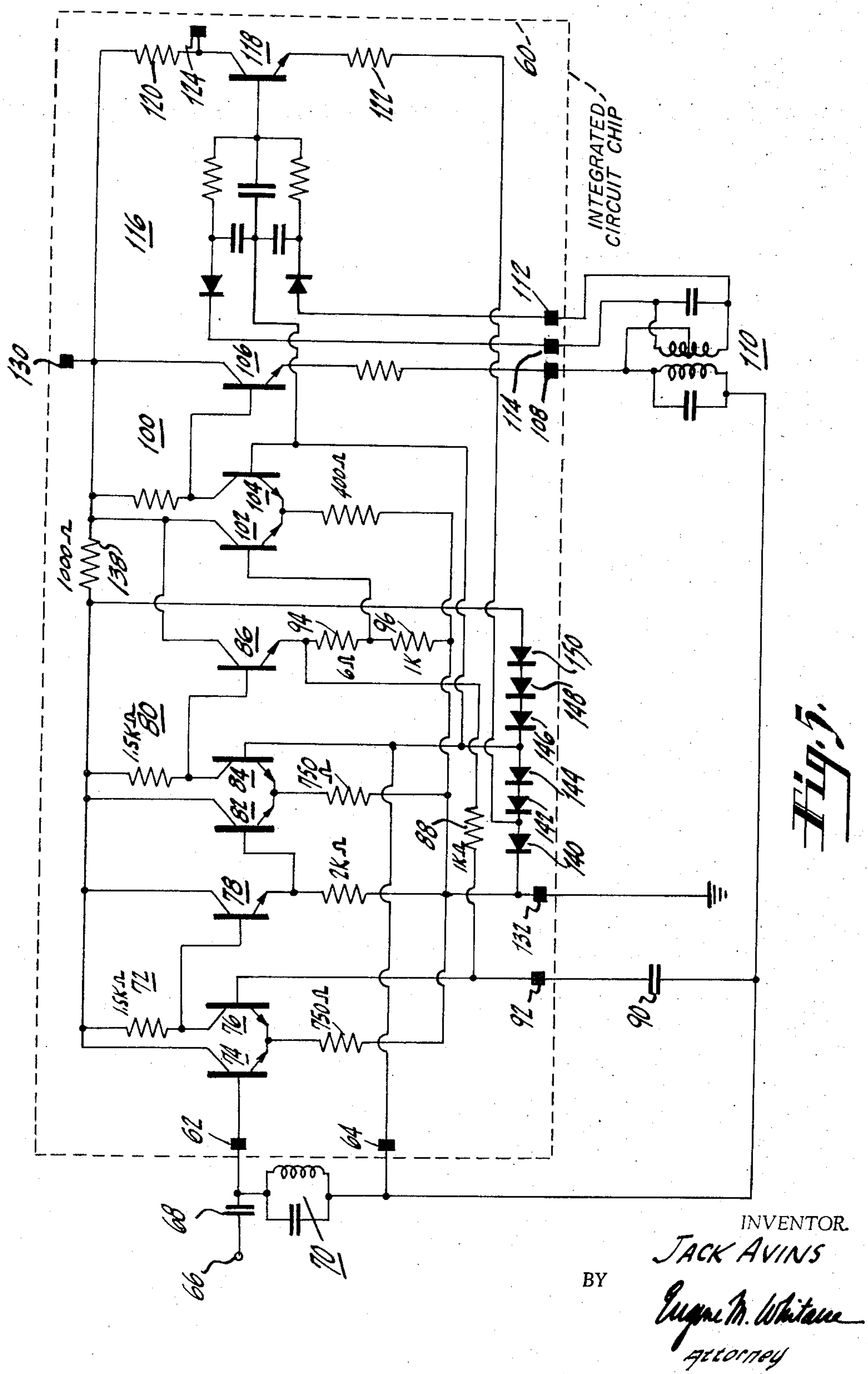

FIGURES 3*a*, 3*b* and 3*c* are graphs showing the frequency response of the amplifier circuit of FIGURE 2 for different conditions in the feedback circuit thereof;

FIGURES 4*a* and 4*b* represent circuit elements which may be connected in the feedback circuit of the amplifier shown in FIGURE 2;

FIGURE 5 is a schematic circuit diagram of an angle modulated wave processing channel for television receivers which may be incorporated in an integrated circuit device; and FIGURE 6 is a schematic circuit diagram of a voltage supply useful in the processing channel of FIGURE 5.

Figure 1:
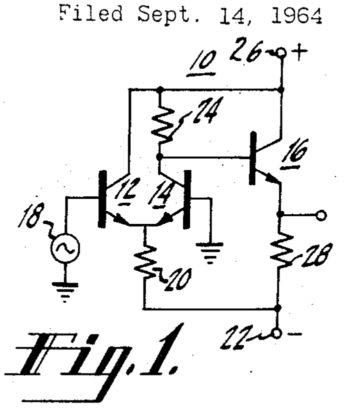
FIGURE 1 is a schematic circuit diagram of an amplifier stage embodying the invention.

The schematic circuit diagram of FIGURE 1 shows a direct coupled amplifier stage 10 which may comprise a basic building block for integrated circuits. The amplifier stage 10 includes three transistors 12, 14 and 16 connected to provide an emitter coupled amplifier circuit driving an emitter follower circuit.

The emitter coupled amplifier circuit includes the transistor 12 connected in the common collector configuration, driving the transistor 14 which is connected in the common base configuration. Signals from a source 18, not necessarily included in the integrated circuit device, are applied to the base electrode of the transistor 12. Coupling between the transistors 12 and 14 is effected by the direct-emitter connection and the resistor 20 which is connected in common between the emitter electrodes of the transistors 12 and 14 and the negative terminal 22 of an operating potential supply. The base electrode of transistor 14 is connected to the ground. A load resistor 24 is connected between the collector electrode of the transistor 14 and a positive terminal 26 of the operating potential supply. Amplified signals developed across the load resistor 24 are directly applied to the base electrode of the transistor 16 which is connected in an emitter follower circuit. Output signals from the stage 10 are developed across the emitter follower load resistor 28.

The operating potential supply source, not shown, comprises a three terminal supply providing symmetrical positive and negative voltages relative to ground. By way of example, the voltages at the terminals 26 and 22 may be plus two volts and minus two volts respectively, with ground as a reference.

In the present example the emitter coupled amplifier circuit is balanced for symmetrical operation by maintaining the base electrodes of the transistors 12 and 14 at substantially the same (ground) potential. Further amplifier stages of the same circuit configuration as the amplifier stage 10 can be directly driven by the amplifier stage 10 of the D-C voltage at the emitter electrode of the transistor 16 is held at ground potential. In such a case the emitter coupled amplifier or limiter of succeeding stages will be balanced since the base electrodes of the first transistor therein will be at ground potential. It should be noted at this point that for some circuit applications a deliberate unbalance of succeeding emitter coupled amplifiers may be desirable.

The desired D-C output voltage level is established by setting the quiescent voltage at the collector of the transistor 14 at a voltage exceeding the desired D-C output voltage by an amount equal to the voltage drop ($V_{be}$) across the base-to-emitter junction of the transistor 16. To provide zero output voltage relative to ground, the voltage at the collector electrode of the transistor 14 is set to about +.65 volt, and the opposing plus-to-minus .65 volt across the base-to-emitter junction of the transistor 16 results in zero volts at the emitter electrode of the transistor 16. Thus succeeding stages may be directly connected in cascade without the necessity for complicated biasing networks.

The circuit can be stabilized against temperature changes and power supply variations by selecting the resistor 24 to be twice as large as the resistor 20. Temperature changes tend to change the voltage $V_{be}$ between the emitter and base of the three transistors. In the transistors 12 and 14, assume that temperature changes cause a change in $V_{be}$ by an amount $\Delta V_{be}$, and that as a result the current of each transistor 12 and 14 changes by an amount $\Delta i$.

Then $$\Delta V_{be}=2\Delta i R_{20} \quad (1)$$

rearranging $$\Delta i=\frac{\Delta V_{be}}{2R_{20}} \quad (2)$$

in which $R_{20}$ is the resistance of resistor 20. Then the change in the collector voltage of the transistor 14

$$\Delta V^c=\Delta i R_{24} \quad (3)$$

in which $R_{24}$ is the resistance of resistor 24. Substituting (2) in (3)

$$\Delta V_o=\frac{\Delta V_{be} R_{24}}{2R_{20}} \quad (4)$$

The change in voltage at the emitter electrode of the transistor 16 is $\Delta V_c - \Delta V_{be}$ or $$\frac{\Delta V_{be} R_{24}}{2R_{20}}-\Delta V_{be}=\Delta V_{be}\left(\frac{R_{24}}{2R_{20}}-1\right)$$

If $R_{24}=2R_{20}$, then the net change in voltage at the emitter electrode of the transistor 16 is zero. In other words, if the resistor 24 is made twice as large as the resistor 20, the rise in voltage at the emitter follower output due to its decreasing $V_{be}$ with increasing temperature is compensated by the fall in voltage at the collector of the transistor 14.

Next, consider the effects of operating potential supply variation. If the voltage at the terminal 26 drops by a voltage $\Delta e_1$, (becomes less positive) then the output voltage at the collector of transistor 14 falls a like amount because the current through transistor 14 remains constant. If the voltage at the terminal 22 drops by a voltage $\Delta e_2$, (becomes less negative) the emitter current per transistor falls by $$\frac{\Delta e_2}{2R_{20}}$$

and the collector voltage rises by $$\frac{\Delta e_2 R_{24}}{2R_{20}}$$

Thus the net change in voltage at collector of the transistor 14 is $$\Delta e_1-\frac{\Delta e_2 R_{24}}{2R_{20}}$$

Again, if the resistor 24 is made twice the value of the resistor 20, then the net change in voltage at the collector of the transistor 14 is $\Delta e_1 - \Delta e_2$. It is advantageous to derive $e_1$ and $e_2$ from a common power source so that $e_1$ and $e_2$ will change in the same proportion.

An important fact to be noted here is that the ratios of the resistors 20 and 24 are more important to the maintenance of stability than their absolute values. This is of special significance in integrated circuit fabrication since the two resistors can be formed at the same time and their ratios can be readily maintained whereas the absolute resistance values are a function of the variables in the fabrication processes. Accordingly with a given process procedure, a higher yield of useable circuits can be expected where the ratios of the circuit components are more significant than the absolute values.

The schematic circuit diagram of FIGURE 2 includes a pair of amplifying stages 30 and 32 directly connected in cascade. The stage 32 is the same as that shown in FIGURE 1 and the stage 30 differs from the circuit shown in FIGURE 1 in that a direct current feedback loop has been included to provide operating point stabilization.

The amplifier stage 30 includes a pair of transistors 34 and 36 connected to operate as an emitter coupled amplifier, and a third transistor 38 connected to operate as an emitter follower amplifier. The output signals from the amplifier stage 30 are developed across a load resistor 40. The D-C feedback circuit includes a resistor 42 connected between the emitter electrode of the transistor 38 and the base electrode of the transistor 36. A capacitor 44 connects the base electrode of the transistor 36 to ground.

Base current of the transistor 36 flowing through the resistor 42 tends to establish the base electrode of the transistor 39 at a positive voltage relative to ground. Such a voltage tends to unbalance the emitter coupled amplifier portion of the stage 32 because the direct voltage at the base electrodes of the transistor 39 and 41 would be different. To preclude unbalance and preserve symmetrical limiting in the circuit, an offset voltage is developed in the feedback loop. The offset voltage is developed across a resistor 46 connected between the emitter of the transistor 38 and the load resistor 40. The resistor 46 is of a value to develop a voltage equal to the voltage developed across the resistor 42. Since the voltages across the resistors 42 and 46 are in opposition, the base electrode of the transistor 36 is operated at ground potential, and, at the same time, the D-C output voltage at the junction of the resistors 40 and 46 is at ground potential. Complete balance is thereby obtained.

Figure 3:
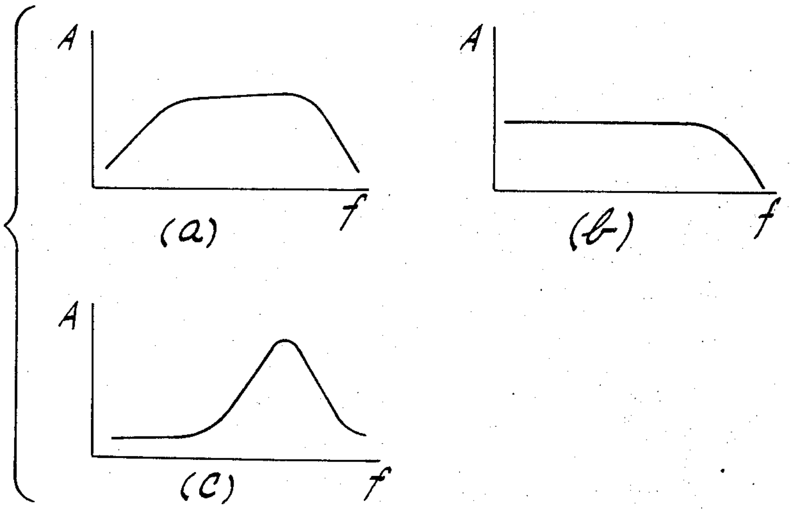

The capacitor 44 provides maximum feedback voltages at D-C or low frequencies. The frequency response of the amplifier stage of FIGURE 2 is shown in FIGURE 3(*a*) which is a plot of amplitude of the output signal against frequency. The drop in gain at low frequencies is due to the low frequency negative feedback, and the drop in gain at high frequencies is due to shunt capacities in the integrated circuit.

Other forms of feedback can be used. For example, if the capacitor 44 is replaced by a resistor as shown in FIGURE 4*a*, the frequency response becomes relatively flat from D-C to some higher frequency determined by the resistance "level" as shown in FIGURE 3(*b*). The upper frequency limit has been found to be as high as 100 mc./s. when collector resistors for the transistors 36 and 41 were of low values such as of the order of 150 ohms. If a selective network, such as the series tuned circuit shown in FIGURE 4*b*, is used to replace the capacitor 44 the response assumes a bandpass characteristic as shown in FIGURE 3(*c*). Thus, it can be seen that the shape of the frequency passband characteristic is established by the type of feedback circuit used.

In the circuit of FIGURE 2, the amplifier stage 30 is operated at low power levels and the amplifier stage 32 is operated at higher power levels. To this end, the symmetrical positive and negative voltages applied to the terminals 54 and 56 are smaller in magnitude than the positive and negative voltages applied to the terminals 50 and 52. The high level stage 32 need not be included in the feedback loop since it is automatically balanced by the feedback which precedes it. The fact that the amplifier stage 32 is not included in the feedback loop reduces the amount of open loop gain enclosed by the feedback loop, and thereby reduces the possibility of oscillation. It should be noted that neither the voltage nor resistance ratios need be maintained in the high level stage 32. The emitter follower portions of the stage 32 is not substantially affected by unbalance of the emitter coupled portion of the stage, and the emitter of the emitter follower need not be maintained at ground potential.

The schematic circuit diagram of FIGURE 5 shows the use of multiple three transistor amplifier stages in the sound channel of a television receiver. The rectangle 60 schematically illustrates a monolithic semiconductor circuit chip. The chip has a plurality of contact areas about the periphery thereof through which connections to the circuit on the chip may be made. For example, the chip 60 has a pair of contact areas 62 and 64 which are coupled to a source of FM waves. As to physical dimensions, the chip 60 may be of the order of 50 mils x 50 mils, or smaller.

FM signals from a suitable source such as a video detector or a video amplifier of a television receiver are applied to a terminal 66 and coupled through a capacitor 68 to a resonant circuit 70 which is tuned to the 4.5 mc./s. intercarrier beat between the video and sound carriers of a television signal. The resonant circuit 70 and the coupling capacitor 68 in the present example are external to the chip but are coupled thereto through the contact areas 62 and 64. It is noted that the principles of the invention are readily adapted to broadcast FM receivers.

The contact area 62 is directly coupled to a first amplifier stage 72 including three transistors 74, 76 and 78. The first two transistors 74 and 76 are connected to provide an emitter coupled amplifier and the third transistor 78 is connected as an emitter follower as described above.

The amplifier stage 72 is directly coupled to a similar amplifier stage 80 which also includes three transistors 82, 84 and 86. A feedback circuit including a resistor 88 is connected between the emitter electrode of the transistor 86 and the base electrode of the transistor 76. A capacitor 90, which may not be on the integrated circuit chip, connects the base electrode of the transistor 76 to a common circuit for the base electrodes of the transistors 74 and 84. The capacitor 90 is connected to the integrated circuit chip through a contact area 92. An offset voltage is developed in the feedback circuit across a resistor 94 to oppose and cancel the voltage developed across the feedback resistor 88 as described in connection with FIGURE 2.

Output signals from the stage 80 are developed across a resistor 96 and applied to a high level amplifier stage 100 including three transistors 102, 104 and 106. The emitter follower transistor 106 portion of the stage 100 is connected through a contact area 108 to drive the primary winding of a discriminator transformer 110. The secondary winding of the discriminator transformer is connected through a pair of contact areas 112 and 114 to the remainder of the discriminator circuit 116. The discriminator circuit 116 is balanced to provide a direct output voltage at the base of the transistor 118 which does not vary with signal level or power supply fluctuations.

The demodulated signals applied to the base electrode of the transistor 118 are developed across the resistor 120, and are taken from the semiconductor chip through the contact area 124.

The circuit of FIGURE 5 differs from that of FIGURES 1 and 2 in that the operating potential supply is unbalanced. In other words all of the voltages in the circuit are positive relative to ground. To this end the positive terminal of a D-C supply source which may be subject to some variation is connected to the contact area 130, and the grounded negative terminal is connected to the contact area 132. The unregulated voltage between the contact areas 130 and 132 is directly applied to the transistors of the high level amplifier stage 100.

A resistor 138 and six rectifiers, 140, 142, 144, 146, 148 and 150, all formed on the integrated circuit chip, are connected in series between the power supply terminals 130 and 132, and provide regulated operating voltages for the amplified stages 72 and 80. The rectifiers 140–150 are poled to be forward biased by the supply connected across the terminals 130 and 132, and provide a substantially constant voltage drop for relatively wide fluctuations of the supply voltage. The full voltage across the six rectifiers provides the collector voltage supply for the transistors used in the amplifier stages 72 and 80, except for the emitter follower transistor 86, and the voltage developed across the rectifiers 140, 142 and 144 is used to provide the base voltage for the transistors 74, 84 and 104.

The voltage regulating system described is not only advantageous in that it is easily incorporated in an integrated circuit chip, but it also provides readily available regulated voltages between the various rectifiers. For example, the base electrode of the transistor 118 is connected through the discriminator transformer to the junction between the rectifiers 144 and 146 and is thus held at about plus two volts above ground. The appropriate biasing potential for the transistor 118 is then provided by returning the emitter electrode through the resistor 122 to a point between the rectifiers 140 and 142. Since the voltage drop per rectifiers is about 0.65 volt, about 1.3 volts is applied between the base and emitter electrodes of the transistor 118, a portion of which is dropped across the resistor 122. As in the case of the circuit of FIGURE 2, the output amplifier stage 100 is not included within the feedback loop. However the feedback loop maintains the voltage across the resistor 96 at the same level as the voltage applied to the base of the transistor 104, hence the emitter coupled amplifier portion of the amplifier stage 100 is automatically balanced. It may be desirable in some applications to hold the voltage across the resistor 96 at a value different from that applied to the base electrode of the transistor 104. By way of example, such an unbalance in the base bias voltages permits a greater collector voltage swing for the transistor 104, and hence a larger amplitude output signal.

The circuit configuration is such that transient or steady state overloads applied to the base electrode of the transistor 74 does not introduce surges in the feedback network or in the output circuit of the amplifier. This is a result of the higher degree of symmetrical limiting obtained in the emitter coupled amplifier and the linearity of the emitter follower. This insensitivity to overload conditions prevents undesirable shifts in the operating point of the amplifier with signal level which would cause a shift in the clipping axis and thereby degrade the limiting performance of the circuit. The fundamental configuration of each amplifier stage is such that the input circuit has a high input impedance and is free of feedback through the collector-to-base capacitance of the first transistor of each stage. The freedom from Miller-effect feedback also increases the gain and bandwidth of the amplifier, reduces phase shifts of the signal and improves the overall stability. The circuit of FIGURE 5 provides outstanding performance as an amplifier-limiter. A dynamic range of over 70 db has been obtained because the absence of rectification and other non-linear effects in each of the amplifier stages prevents the operating point from shifting even under extreme overload conditions.

The absence of coupling capacitors between the various amplifier stages provides advantages both to the topology of the resultant integrated circuit, and in the integrated circuit performance. As mentioned above, coupling capacitors take up a large area on the integrated circuit. In addition, the coupling capacitors add parasitic capacitance which reduces the bandwidth of the circuit.

In high gain amplifier and limiter circuits which are required to handle large signals with a large percentage of amplitude modulation, greater regulation of the power supply voltage is required. The internal resistance of the rectifiers 140–150 of FIGURE 5 is sufficiently high so that changes in the load current drawn by the transistors of the amplifier stages 72 and 80 may produce changes in the voltages applied to these transistors. The two emitter coupled portions (transistors 74 and 76 and transistors 82 and 84) are essentially constant current, and amplitude modulation does not materially affect the current drawn by these stages. However the emitter follower transistors 78 and 86 draw current as a function of the amplitude modulation. These current changes operating against the internal resistance of these rectifiers may adversely affect the operation of the system. Accordingly, as shown in FIGURE 5, the transistor 86 collector, which operates at higher signal level than the transistor 78, is not supplied by the rectifier divider 140–150, but is returned to the operating potential terminal 130.

A lower impedance voltage supply may be provided on the integrated circuit chip as shown in FIGURE 6. A pair of transistors 160 and 162, connected as emitter followers provide the desired impedance transformation. An additional rectifier 143 is provided to offset the base-to-emitter drop of the transistors 160 and 162. Operating potential for the collector electrodes of transistors 74, 76, 78, 82, 84 and 86 is provided at the emitter electrode terminal 164 of the transistor 160. The intermediate potential derived between the rectifiers 144 and 146 of FIGURE 5 is available at the emitter electrode terminal 166 of transistor 162. The terminal 168 of FIGURE 6 is adapted to be connected to the transistor 118 through the resistor 122.

The emitter followers present a lower impedance than the rectifiers 140–150, and hence variations in load current due to amplitude modulation produce a much smaller change in supply voltage. As a result, with the circuit of FIGURE 6, the collector electrode of the transistor 86 may be returned to the regulated supply terminal 164, with appropriate adjustment of the emitter load resistor value of that transistor.

What is claimed is:

1. A signal translating stage comprising:
first, second and third transistors each having base, emitter and collector electrodes;
means including first and second resistors connecting said first and second transistors as an emitter coupled amplifier circuit, said first resistor connected in common with the emitter electrodes of said first and second transistors, and said second resistor connected in the collector electrode circuit of said second transistor, said second resistor having substantially twice the resistance value of said first resistor;
means connecting said third transistor as an emitter follower circuit; and
means providing a direct current connection between the collector electrode circuit of said second transistor and the base electrode of said third transistor for applying signals from said emitter coupled amplifier circuit to said emitter follower circuit.

2. A signal translating stage as defined in claim 1 wherein said first, second and third transistors, said emitter coupled amplifier circuit connecting means, said emitter follower circuit connecting means, and said direct current connecting means are all disposed in a single integrated circuit.

3. A signal translating stage comprising:
first, second and third transistors each having base, emitter and collector electrodes;
first and second terminals adapted to be connected to an operating potential supply source, and a third terminal adapted to be maintained at a potential intermediate to the potentials at said first and second terminals;
signal input circuit means connected to the base electrode of said first transistor;
a first resistor connected between the emitter electrode of said first and second transistors and said first terminal;
a second resistor having a resistance value twice as large as the resistance value of said first resistor connected between the collector electrode of said second transistor and said second terminal;
a direct current connection from the collector electrode of said first transistor to said second terminal;
means connecting the base electrode of said second transistor to said third terminal;
a direct current connection from the collector electrode of said second transistor to the base electrode of said third transistor;
a direct current connection from the collector electrode of said third transistor to said second terminal; and
a third resistor connected between the emitter electrode of said third transistor and said first terminal.

4. A signal translating circuit comprising:
first, second and third transistors each having base, emitter and collector electrodes;
means including first and second resistors connecting said first and second transistors as an emitter coupled amplifier circuit, said first resistor connected in common with the emitter electrodes of said first and second transistors, and said second resistor connected in the collector electrode circuit of said second transistor, said second resistor having substantially twice the resistance value of said first resistor;

signal input circuit means connected to the base electrode of said first transistor;

means connecting said third transistor as an emitter follower circuit having a load resistor;

means providing a direct current connection between the collector electrode circuit of said second transistor and the base electrode of said third transistor for applying signals from said emitter coupled amplifier circuit to said emitter follower circuit; and a direct current feedback circuit connected between the emitter electrode of said third transistor and the base electrode of said second transistor.

5. A signal translating circuit as defined in claim 4 wherein said direct current feedback circuit includes a third resistor.

6. A signal translating circuit as defined in claim 5 including means in said direct current feedback circuit for developing an off-set voltage substantially equal in magnitude and opposite in polarity to the voltage developed across said third resistor.

7. A signal translating circuit as defined in claim 6 wherein said off-set voltage means included in said direct current feedback circuit includes a fourth resistor.

8. A signal translating system comprising:

first, second and third transistors each having base, emitter and collector electrodes;

first and second terminals adapted to be connected to an operating potential supply source, and a third terminal adapted to be maintained at a potential intermediate the potentials to be maintained at said first and second terminals;

signal input circuit means connected to the base electrode of said first transistor;

a first resistor connected between the emitter electrodes of said first and second transistors and said first terminal;

a second resistor connected between the collector electrode of said second transistor and said second terminal;

a direct current connection from the collector electrode of said first transistor to said second terminal;

a direct current connection from the collector electrode of said second transistor to the base electrode of said third transistor;

a direct current connection from the collector electrode of said third transistor to said second terminal;

third and fourth resistors connected in series between the emitter electrode of said third transistor and said first terminal;

a fifth resistor connected between the emitter electrode of said third transistor and the base electrode of said second transistor, said third resistor being of a value to develop a voltage of a magnitude equal to the voltage developed across said fifth resistor;

impedance means connected between the base electrode of said second transistor and said third terminal; and signal output circuit means connected to the junction of said third and fourth resistors.

9. A signal translating circuit as defined in claim 8 wherein said impedance means comprises a capacitor.

10. A signal translating circuit as defined in claim 8 wherein said impedance means comprises a resistor.

11. A signal translating circuit as defined in claim 8 wherein said impedance means comprises a series resonant circuit.

12. A signal translating circuit comprising:

a first amplifier stage including first, second and third transistors each having base, emitter and collector electrodes, means including first and second resistors connecting said first and second transistors as an emitter coupled amplifier circuit, said first resistor connected in common with the emitter electrodes of said first and second transistors and said second resistor connected in the collector electrode circuit of said second transistor, said second resistor having twice the resistance value of said first resistor, signal input circuit means connected to the base electrode of said first transistor, means connecting said third transistor as an emitter follower circuit, and a direct current connection between the collector electrode circuit of said second transistor and the base electrode of said third transistor for applying signals from said emitter coupled amplifier circuit to said emitter follower circuit, a second amplifier stage including fourth, fifth and sixth transistors each having base, emitter and collector electrodes, means including third and fourth resistors connecting said fourth and fifth transistors as an emitter coupled amplifier circuit, said third resistor connected in common with the emitter electrodes of said fourth and fifth transistors and said fourth resistor connected in the collector electrode circuit of said fifth transistor, said fourth resistor having twice the resistance value of said third resistor, signal input circuit means connecting the base electrode of said fourth transistor to the emitter electrode of said third transistor, means connecting said sixth transistor as an emitter follower circuit, and a direct current connection for applying signals developed across said fourth resistor to the base electrode of said sixth transistor.

13. A signal translating circuit comprising:

a first amplifier stage including first, second and third transistors each having base, emitter and collector electrodes, means including first and second resistors connecting said first and second transistors as an emitter coupled amplifier circuit, said first resistor connected in common with the emitter electrodes of said first and second transistors and said second resistor connected in the collector electrode circuit of said second transistor, signal input circuit means connected to the base electrode of said first transistor, means connecting said third transistor as an emitter follower circuit, a direct current connection from the collector electrode of said second transistor to the base electrode of said third transistor;

a second amplifier stage including fourth, fifth and sixth transistors each having base, emitter and collector electrodes, means including third and fourth resistors connecting said fourth and fifth transistors as an emitter coupled amplifier circuit, said third resistor connected in common with the emitter electrodes of said fourth and fifth transistors, and said fourth resistor connected in the collector electrode circuit of said fifth transistor, a direct current connection between the emitter electrode of said third transistor and the base electrode of said fourth transistor, a direct current connection from the collector electrode of said fifth transistor to the base electrode of said sixth transistor, means including fifth and sixth resistors connecting said sixth transistor as an emitter follower circuit, said fifth and sixth resistors being connected in series with said emitter electrode of said sixth transistor, a direct current feedback circuit connected between the emitter electrode of said sixth transistor and the base electrode of said second transistor;

a third amplifier stage including seventh, eighth and ninth transistors each having base, emitter and collector electrodes, means including seventh and eighth resistors connecting said seventh and eighth transistors as an emitter coupled amplifier circuit, said seventh resistor connected in common with the emitter electrodes of said seventh and eighth transistors and said eighth resistor connected in the collector electrode of said eighth transistor, a direct current connection between the junction of said fifth and sixth resistors and the base electrode of said seventh transistor, means connecting said ninth transistor as an emitter follower circuit; and a direct current connection from the collector electrode of said eighth transistor to the base electrode of said ninth transistor.

14. A signal translating circuit of the type defined in claim 13 wherein the direct operating voltage applied to said seventh, eighth and ninth transistors is of a greater magnitude than the operating voltage applied to said first, second, third, fourth, fifth and sixth transistors.

15. Electronic apparatus including a plurality of semiconductor amplifier devices and resistors interconnected to provide an electrical circuit, a plurality of series connected rectifier devices means for applying a forward biasing direct voltage across said series connected rectifier devices to provide substantially constant voltage drops across each thereof, and means for deriving regulated operating potentials for particular ones of said semiconductor devices across different combinations of said rectifier devices, the magnitudes of which substantially equal the sum of the voltage drops developed across each of said series connected rectifier devices connected within said different combinations, said electrical circuit, said rectifier devices, said means for applying a direct voltage and said means for deriving regulated operating potentials all being disposed in a single integrated circuit.

16. A signal translating stage comprising:

first, second and third transistors each having base, emitter and collector electrodes;

means including first and second resistors connecting said first and second transistors as an emitter coupled amplifier circuit, said first resistor connected in common with the emitter electrodes of said first and second transistors, and said second resistor connected in the collector electrode circuit of said second transistor, means for maintaining the base electrodes of said first and second transistors at substantially the same potential;

means connecting said third transistors as an emitter follower circuit;

means providing a direct current connection between the collector electrode circuit of said second transistor and the base electrode of said third transistor for applying signals from the said emitter coupled amplifier circuit to said emitter follower circuit, and means for biasing at least one of said first and second transistors to establish a potential at the collector electrode of said second transistor which reverse biases the collector-to-base junction of said second transistor by an amount equal to the base-to-emitter voltage of said third transistor.

17. Electronic apparatus comprising an electrical circuit, a plurality of series connected rectifier devices, means including a resistor for applying a forward biasing direct voltage across said series connected rectifier devices to provide substantially constant voltage drops across each thereof, a transistor having base, emitter and collector electrodes, load means directly connected with said emitter electrode, means for applying said direct voltage between said collector electrode and a terminal of said load means remote from said emitter electrode, and means connecting a predetermined number of said series connected rectifier devices between said base electrode and the terminal of said load means remote from said emitter electrode to provide a regulated operating potential for said electrical circuit at said emitter electrode, the magnitude of which substantially equals the sum of the voltage drops developed across each of the series connected rectifier devices so connected by said last mentioned connecting means less the base electrode-to-emitter electrode voltage drop of said transistor; at least a portion of said electrical circuit, said rectifier devices, said resistor, and said transistor all being disposed in a single integrated circuit.

18. Electronic apparatus including an electrical circuit, a plurality of series connected rectifier devices, means including a resistor for applying a forward biasing direct voltage across said series connected rectifier devices to provide substantially constant voltage drops across each thereof, first and second transistors each having base, emitter and collector electrodes, first load means connected with the emitter electrode of said first transistor, means for applying said direct voltage between the collector electrode of said first transistor and a terminal of said first load means remote from the emitter electrode of said first transistor, means connecting a predetermined number of said series connected rectifier devices between the base electrode of said first transistor and the terminal of said first load means remote from the emitter electrode of said first transistor, second load means connected with the emitter electrode of said second transistor, means for applying said direct voltage between the collector electrode of said second transistor and a terminal of said second load means remote from the emitter electrode of said second transistor, and means connecting a different number of said series connected rectifier devices between the base electrode of said second transistor and the terminal of said second load means remote from the emitter electrode of said second transistor to provide first and second regulated operating potentials for said electrical circuit at the emitter electrode of said first and second transistors respectively, the magnitude of said first regulated operating potential being substantially equal to the sum of the voltage drops developed across each of the series connected rectifier devices so connected by said first mentioned connecting means less the base electrode-to-emitter electrode voltage drop of said first transistor, and the magnitude of said second regulated operating potential being substantially equal to the sum of the voltage drops developed across each of the series connected rectifier devices so connected by said last mentioned connecting means less the base electrode-to-emitter electrode voltage drop of said second transistor; at least a portion of said electrical circuit, said rectifier devices, said resistor, said first transistor, and said second transistor all being disposed in a single integrated circuit.

19. Electronic apparatus including an electrical circuit, first and second terminals for connection to a source of direct voltage, a resistor and a plurality of rectifier devices connected in series between said first and second terminals, with each of said rectifier devices being forward biased by said direct voltage to provide a substantially constant voltage drop across each thereof, a transistor having base, emitter and collector electrodes, means connecting said base electrode to a point intermediate two of the series connected rectifiers, means connecting said collector electrode to said first terminal, and circuit means adapted to be connected between said emitter electrode and said second terminal to provide a regulated operating potential at said emitter electrode for said electrical circuit, the magnitude of which substantially equals the sum of the voltage drops developed across each of the series connected rectifier devices so connected between said base electrode and said second terminal by said first mentioned connecting means less the base electrode-to-emitter electrode voltage drop of said transistor; said resistor, said rectifier devices and said transistor all being disposed in a single integrated circuit.

20. Electronic apparatus including:

a first amplifier stage including first, second and third transistors each having base, emitter and collector electrodes, means including first and second resistors connecting said first and second transistors as an emitter coupled amplifier circuit, said first resistor connected in common with the emitter electrodes of said first and second transistors and said second resistor connected in the collector electrode circuit of said second transistor, signal input circuit means connected to the base electrode of said first transistor, means connecting said third transistor as an emitter follower circuit, a direct current connection from the collector electrode of said second transistor to the base electrode of said third transistor;

a second amplifier stage including fourth, fifth and sixth transistors each having base, emitter and collector electrodes, means including third and fourth resistors connecting said fourth and fifth transistors as an emitter coupled amplifier circuit, said third resistor connected in common with the emitter electrodes of said fourth and fifth transistors and said fourth resistor connected in the collector electrode circuit of said fifth transistor, a direct current connection between the emitter electrode of said third transistor and the base electrode of said fourth transistor, means including a fifth resistor connecting said sixth transistor as an emitter follower circuit, said fifth resistor being connected in series with said emitter electrode of said sixth transistor, a direct current connection from the collector electrode of said fifth transistor to the base electrode of said sixth transistor, first and second terminals for connection to a source of direct potential, a resistor and a plurality of rectifier devices connected in series between said first and second terminals, means directly connecting the collector electrode circuits of said first, second, third, fourth and fifth transistors to receive a voltage regulated by said rectifier devices, and means connecting the collector electrode circuit of said sixth transistor to said first terminal, said first, second, third, fourth, fifth and sixth transistors, said emitter coupled amplifier circuit connecting means, said emitter follower circuit connecting means, and said direct current connecting means of each of said first and second amplifier stages, and said resistor and rectifier devices all being disposed in a single integrated circuit.

21. Electronic apparatus as defined in claim 20 wherein said means directly connecting the collector electrode circuits of said first, second, third, fourth and fifth transistors to receive said regulated voltage includes a seventh transistor.

22. A signal translating stage comprising:

first and second transistors, each having base, emitter and collector electrodes;

means for connecting said first transistor as a signal translating circuit;

means for connecting said second transistor as an emitter follower circuit;

means for direct current coupling signals from the collector electrode of said first transistor to the base electrode of said second transistor;

means for biasing said first transistor to establish a potential at its collector electrode which reverse biases the collector-base junction thereof by an amount substantially equal to the forward base-to-emitter voltage of said second transistor;

and means for supplying signals to be translated between the base and emitter electrodes of said first transistor.

23. A signal translating stage as defined in claim 22 wherein said first and second transistors, said signal translating circuit connecting means, said emitter follower circuit connecting means, said direct current coupling means, and said biasing means are all disposed in a single integrated circuit.

24. A signal translating system comprising:

at least two signal translating stages, each of which includes a pair of transistors connected as an emitter coupled amplifier circuit, a third transistor connected as an emitter follower circuit, and means for direct current coupling signals from the emitter coupled amplifier circuit of each stage to the emitter follower circuit of said stage;

means for direct current coupling signals from the emitter follower circuit of each stage to the emitter coupled amplifier circuit of the next succeeding stage;

a direct current feedback connection from the emitter follower circuit of a succeeding signal translating stage to one of the pair of emitter coupled amplifier transistors of the first such stage;

means for supplying signals to be translated to the other of said pair of emitter coupled amplifier transistors of said first stage;

and means for applying a greater direct current operating voltage to the transistors of the last signal translating stage of said system then is applied to the transistors of each of the preceding signal translating stages.

25. A signal translating circuit comprising:

first, second and third transistors each having base, emitter and collector electrodes;

means including first and second resistors connecting said first and second transistors as an emitter coupled amplifier circuit, said first resistor connected in common with the emitter electrodes of said first and second transistors, and said second resistor connected in the collector electrode circuit of said second transistor;

signal input circuit means connected to the base electrode of said first transistor;

means connecting said third transistor as an emitter follower circuit;

direct current signal coupling means between the collector electrode of said second transistor and the base electrode of said third transistor for maintaining the direct voltage at the base electrode of said third transistor substantially equal to the direct voltage at the collector electrode of said second transistor;

means for biasing said second transistor to establish a potential at its collector electrode which reverse biases the collector-base junction thereof by an amount substantially equal to the forward base-to-emitter voltage of said third transistor; and a direct current feedback circuit connected between the emitter electrode of said third transistor and the base electrode of said second transistor.

26. A signal translating stage comprising:

first, second and third transistors each having base, emitter and collector electrodes;

means including first and second resistors connecting said first and second transistors as an emitter coupled amplifier circuit, said first resistor connected in common with the emitter electrodes of said first and second transistors, and said second resistor connected in the collector electrode circuit of said second transistor;

means connecting said third transistor as an emitter follower circuit, said means including resistive means connected to the emitter electrode of said third transistor;

an output terminal connected to said resistive means;

means providing a direct current connection between the collector electrode of said second transistor and the base electrode of said third transistor for applying signals from said emitter coupled amplifier circuit to said emitter follower circuit; and means for biasing said first and second transistors to establish a potential at the collector electrode of said second transistor sufficient to maintain the output terminal connected to said resistive means at substantially the same quiescent direct current potential as at the base electrode of said first transistor.

27. A signal translating system comprising:

at least two signal translating stages, each of which includes a pair of transistors connected as an emitter coupled amplifier circuit, a third transistor connected as an emitter follower circuit and means for direct current coupling signals from the emitter coupled amplifier circuit of each stage to the emitter follower circuit of said stage;

means for direct current coupling signals from the emitter follower circuit of each stage to the emitter coupled amplifier circuit of the next succeeding stage;

a direct current feedback connection from the emitter follower circuit of a succeeding signal translating stage to one of the pair of emitter coupled amplifier transistors of the first such stage; and means for supplying signals to be translated to the other of said pair of emitter coupled amplifier transistors of said first stage.

28. A signal translating system comprising:

first, second and third transistors each having base, emitter and collector electrodes;

first and second terminals adapted to be connected to an operating potential supply source, and a third terminal adapted to be maintained at a potential intermediate the potentials to be maintained at said first and second terminals;

signal input circuit means connected to the base electrode of said first transistor;

a first resistor connected between the emitter electrodes of said first and second transistors and said first terminal;

a second resistor connected between the collector electrode of said second transistor and said second terminal;

a direct current connection from the collector electrode of said first transistor to said second terminal;

a direct current connection from the collector electrode of said second transistor to the base electrode of said third transistor;

a direct current connection from the collector electrode of said third transistor to said second terminal;

third and fourth resistors connected in series between the emitter electrode of said third transistor and said first terminal;

a fifth resistor connected between the emitter electrode of said third transistor and the base electrode of said second transistor, said third resistor being of a value to develop a voltage of a magnitude equal to the voltage developed across said fifth resistor;

means connecting the base electrode of said second transistor to said third terminal; and signal output circuit means connected to the junction of said third and fourth resistors.

29. A signal translating system comprising:

first, second and third transistors each having base, emitter and collector electrodes;

first and second terminals adapted to be connected to an operating potential supply source;

signal input circuit means connected to the base electrode of said first transistor;

a first resistor connected between the emitter electrodes of said first and second transistors and said first terminal;

a second resistor connected between the collector electrode of said second transistor and said second terminal;

a direct current connection from the collector electrode of said first transistor to said second terminal;

a direct current connection from the collector electrode of said second transistor to the base electrode of said third transistor;

a direct current connection from the collector electrode of said third transistor to said second terminal;

third and fourth resistors connected in series between the emitter electrode of said third transistor and said first terminal;

means for biasing said first and second transistors to establish a potential at the collector electrode of said second transistor sufficient to maintain the junction of said third and fourth resistors at the same quiescent direct current potential as at the base electrode of said first transistor;

and signal output circuit means connected to the junction of said third and fourth resistors.

30. A signal translating stage comprising:

first, second and third transistors each having base, emitter and collector electrodes;

means including first and second resistors connecting said first and second transistors as an emitter coupled amplifier circuit, said first resistor connected in common with the emitter electrodes of said first and second transistors, and said second resistor connected in the collector electrode circuit of said second transistor;

means connecting said third transistor as an emitter follower circuit, said means including third and fourth resistors serially connected between the emitter electrode of said third transistor and a point of reference potential;

means providing a direct current connection between the collector electrode of said second transistor and the base electrode of said third transistor for applying signals from said emitter coupled amplifier circuit to said emitter follower circuit; and means for biasing said first and second transistors to establish a potential at the collector electrode of said second transistor sufficient to maintain the junction of said third and fourth resistors at substantially the same quiescent direct current potential as at the base electrode of said first transistor.

31. A signal translating stage comprising:

first, second and third transistors each having base, emitter and collector electrodes;

means including first and second resistors connecting said first and second transistors as an emitter coupled amplifier circuit, said first resistor connected in common with the emitter electrodes of said first and second transistors, and said second resistor connected in the collector electrode circuit of said second transistor;

means for maintaining the base electrodes of said first and second transistors at substantially the same direct current potential;

means connecting said third transistor as an emitter follower circuit, said means including third and fourth resistors serially connected between the emitter electrode of said third transistor and a point of reference potential;

means providing a direct current connection between the collector electrode of said second transistor and the base electrode of said third transistor for applying signals from said emitter coupled amplifier circuit to said emitter follower circuit;

the resistance values of said first, second, third and fourth resistors and the direct potential at the base electrodes of said first and second transistors being selected to establish a potential at the collector electrode of said second transistor sufficient to maintain the junction of said third and fourth resistors at substantially the same quiescent direct current potential as at the base electrode of said first transistor.

32. A signal translating stage comprising:

first, second and third transistors each having base, emitter and collector electrodes;

means including first and second resistors connecting said first and second transistors as an emitter coupled amplifier circuit, said first resistor connected in common with the emitter electrodes of said first and second transistors, and said second resistor connected in the collector electrode circuit of said second transistor;

means connecting said third transistor as an emitter follower circuit;

means providing a direct current connection between the collector electrode of said second transistor and the base electrode of said third transistor for applying signals from said emitter coupled amplifier circuit to said emitter follower circuit; and means for biasing said first and second transistors to establish a potential at the collector electrode of said second transistor sufficient to maintain the emitter electrode of said third transistor at substantially the same quiescent direct current potential as at the base electrode of said first transistor.

33. A signal translating stage comprising:

first, second and third transistors each having base, emitter and collector electrodes;

means including first and second resistors connecting said first and second transistors as an emitter coupled amplifier circuit, said first resistor connected in common with the emitter electrodes of said first and second transistors, and said second resistor connected in the collector electrode circuit of said second transistor;

means connecting said third transistor as an emitter follower circuit, said means including resistive means connected to the emitter electrode of said third transistor;

means providing a direct current connection between the collector electrode of said second transistor and the base electrode of said third transistor for applying signals from said emitter coupled amplifier circuit to said emitter follower circuit;

bias circuit means coupled to the base electrodes of said first and second transistors and co-operating therewith and with said first and second resistors to establish a potential at a point on said resistive means substantially equal to the quiescent direct potential established by said bias circuit means at the base electrode of said first transistor;

a source of input signals coupled to the base electrode of said first transistor for supplying signals to be translated by said stage; and output circuit means coupled to said resistive means at said point thereon which is at substantially the same quiescent direct current potential as at the base electrode of said first transistor for deriving translated signals corresponding to said supplied signals.

References Cited

UNITED STATES PATENTS

| | | | |
|---|---|---|---|
| 3,003,113 | 10/1961 | MacNichol. | |
| 3,022,457 | 2/1962 | Doan | 323—22 |
| 3,061,799 | 10/1962 | Biard | 332—14 |
| 3,070,762 | 12/1962 | Evans. | |
| 3,092,783 | 6/1963 | Krohn. | |
| 3,130,326 | 4/1964 | Habisohn | 307—88.5 |
| 3,137,826 | 6/1964 | Boudrias. | |
| 3,160,807 | 12/1964 | Packard. | |
| 3,206,619 | 9/1965 | Lin. | |

FOREIGN PATENTS

| | | |
|---|---|---|
| 1,295,540 | 5/1962 | France. |

OTHER REFERENCES

Shaughnessy, The Zener Diode, Popular Electronics, pp. 76–82, June 1961, Slaughter, Feedback Stabilized Transistor Amplifier, Electronics, pp. 174–175 May 1955.

Slaughter (A), The Emitter-Coupled Differential Amplifier, IRE Transactions-Circuit Theory, pp. 51–53, March 1956.

ROY LAKE, *Primary Examiner.*

F. D. PARIS, J. B. MULLINS, *Assistant Examiners.*

UNITED STATES PATENT OFFICE
CERTIFICATE OF CORRECTION

Patent No. 3,366,889 January 30, 1968

Jack Avins

It is hereby certified that error appears in the above numbered patent requiring correction and that the said Letters Patent should read as corrected below.

Column 1, line 69, "les" should read -- less --. Column 4, equation (2), should appear as shown below:

$$\Delta i = \frac{\Delta V_{be}}{2R_{20}}$$

equation (3) should appear as shown below:

$$\Delta V_c = \Delta i R_{24}$$

equation (4) should appear as shown below:

$$\Delta V_c = \frac{\Delta V_{be} R_{24}}{2R_{20}}$$

lines 16 and 17, the equation should appear as shown below:

$$\frac{\Delta V_{be} R_{24}}{2R_{20}} - \Delta V_{be} = \Delta V_{be} \left( \frac{R_{24}}{2R_{20}} - 1 \right)$$

Signed and sealed this 29th day of July 1969.

(SEAL)
Attest:

EDWARD M. FLETCHER, JR.
Attesting Officer

WILLIAM E. SCHUYLER, JR.
Commissioner of Patents